United States Patent
Sakamoto et al.

(10) Patent No.: US 7,210,807 B2
(45) Date of Patent: May 1, 2007

(54) OPTICAL SEMICONDUCTOR DEVICE AND METHOD OF MANUFACTURING OPTICAL SEMICONDUCTOR DEVICE

(75) Inventors: Shin Sakamoto, Kanagawa-ken (JP); Isao Ogawa, Fukuoka-ken (JP); Hideo Tamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 11/028,305

(22) Filed: Jan. 4, 2005

(65) Prior Publication Data
US 2005/0145991 A1 Jul. 7, 2005

(30) Foreign Application Priority Data
Jan. 5, 2004 (JP) ............................. 2004-000603

(51) Int. Cl.
*F21V 9/16* (2006.01)
(52) U.S. Cl. .................. 362/84; 362/267; 362/310; 313/502; 313/512; 257/100
(58) Field of Classification Search ............... 362/267, 362/310, 800, 311; 313/512, 502, 503, 504, 313/116; 257/98
See application file for complete search history.

(56) References Cited

U.S. PATENT DOCUMENTS 6,791,259 B1 * 9/2004 Stokes et al. ............... 313/503
6,800,996 B2 * 10/2004 Nagai et al. ................ 313/512
6,874,910 B2 * 4/2005 Sugimoto et al. ........... 362/294
7,023,019 B2 * 4/2006 Maeda et al. ................ 257/89

FOREIGN PATENT DOCUMENTS

| JP | 8-115993 | 5/1996 |
|----|----------|--------|
| JP | 11-74561 | 3/1999 |
| JP | 2000-183407 | 6/2000 |

* cited by examiner

*Primary Examiner*—Thomas M. Sember
(74) *Attorney, Agent, or Firm*—Finnegan, Henderson, Farabow, Garrett & Dunner, L.L.P.

(57) ABSTRACT

An optical semiconductor device for emitting a light beam includes an outer envelope that forms an indentation in which a light emitting element is positioned. The indentation is divided into a first indentation part corresponding to a lower part of the indentation, and a second indentation part corresponding to an upper part of the indentation. A projection strip between the first and second indentation parts, projects from the inner surface of the outer envelope. A conductive lead supplies an electrical power to the light emitting element.

13 Claims, 7 Drawing Sheets

OPTICAL SEMICONDUCTOR DEVICE AND METHOD OF MANUFACTURING OPTICAL SEMICONDUCTOR DEVICE

CROSS REFERENCE TO RELATED APPLICATION

This application is based upon and claims the benefit of priority from prior Japanese Patent Application No. 2004-000603 filed on Jan. 5, 2004, the entire contents of which are incorporated herein by reference.

BACKGROUND

1. Technical Field

The present invention relates to an optical semiconductor device and a manufacturing method thereof, and more particularly to an optical semiconductor device including a semiconductor device which emits a light beam and a manufacturing method thereof.

2. Description of the Related Art

Figure 5:
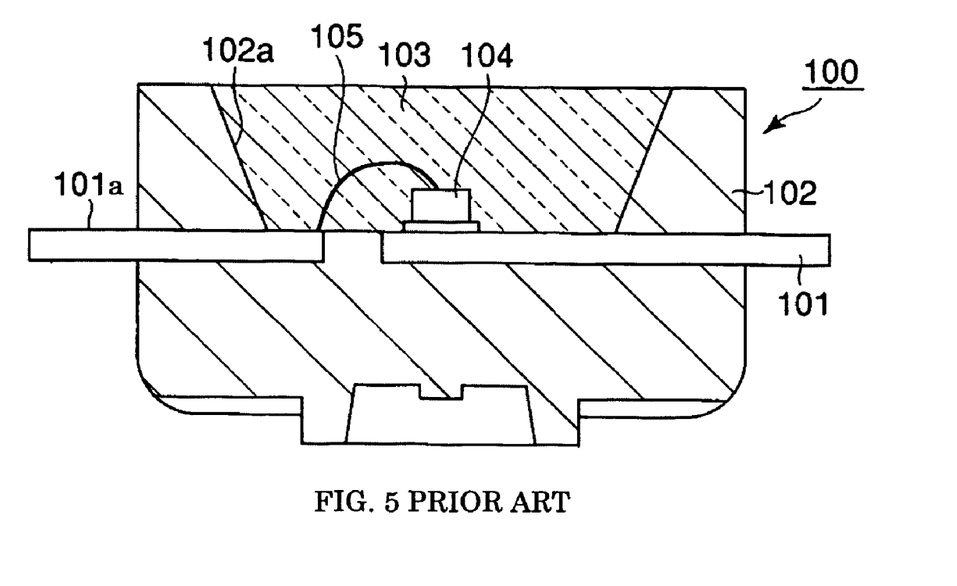
FIG. 5 is a vertical section of a package 100 for an optical semiconductor device.

A package for an optical semiconductor device such as a surface-mounted LED, is formed by inserting an electrically conductive lead in a thermoplastic resin. Japanese Patent Publication (kokai) No. 2000-183407 discloses such a package. FIG. 5 is a vertical section of a package 100 for an optical semiconductor device. Package 100 is provided with a conductive lead 101 and a base 102. Base 102 includes an indentation 102a provided on an upper surface 101a of lead 101. A light emitting element 104 is positioned on lead 101. Indentation 102a is filled with translucent resin to form a translucent part 103. A wire 105 made of gold, electrically connects emitting element 104 and lead 101. A light beam emitted from light emitting element 104 radiates from package 100 through translucent part 103.

Package 100 is manufactured as described next. First, lead 101 is inserted into a die. Then, injection molding is carried out by filling the die with thermoplastic resin to form base 102. After a conductive adhesive is applied on one electrode of lead 101, light emitting element 104 is positioned on the applied conductive adhesive. Wire 105 is bonded to the other electrode of lead 101 to complete a conductive connection to light emitting element 104. Then, after filling into indentation 102a, translucent resin is cured under a certain curing condition to form translucent part 103. As a result, package 100 is produced.

A light beam emitted from element 104 radiates through translucent part 103. The angle of the beam spread ranges from 100-degree to 120-degree. Therefore, it is difficult to focus the light beam outputted from package 100 without a focusing lens or a light reflector. Consequently, package 100 is not suited for illuminating a specific limited region.

Figure 6:
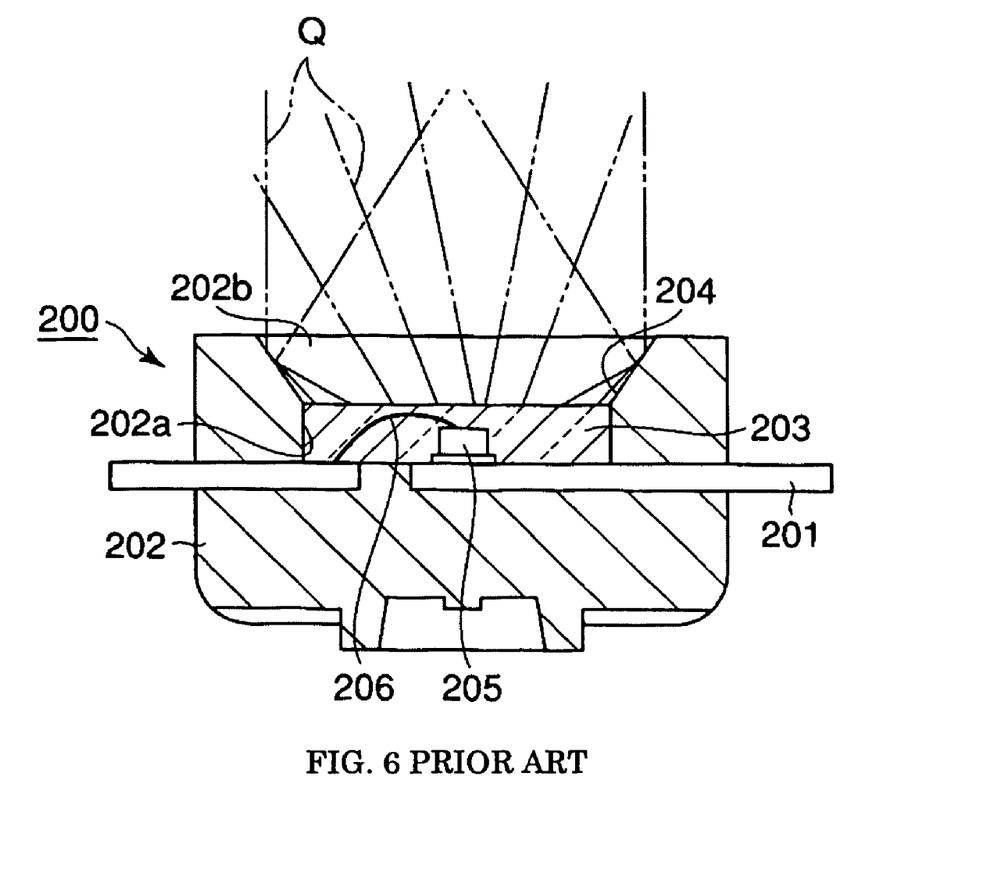
FIG. 6 is a vertical section of a package 200 for an optical semiconductor device.

In order to illuminate a specific region, some packages have a wall for reflecting a light beam to control a directivity thereof. FIG. 6 is a vertical section of a package 200 for an optical semiconductor device as one example of such packages. Package 200 includes a lead 201 and an outer envelope 202. Outer envelope 202 includes a first indentation part 202a and a second indentation part 202b which surrounds first indentation part 202a. A translucent part 203 is formed by filling first indentation 202a with phosphor mixed silicon resin. An inner wall of second indentation part 202b serves as a reflecting wall 204 to reflect a light beam emitted from light emitting element 205. A wire 206 made of gold electrically connects a light emitting element 205 and one of electrodes of lead 201. Q in FIG. 6 designates light rays of the light beam emitted from light emitting element 205.

Figure 7:
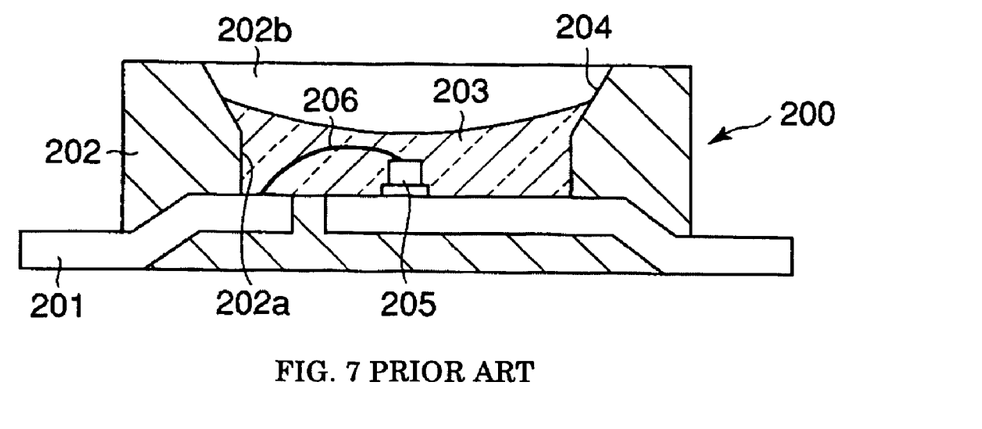
FIG. 7 is a vertical section of package 200 showing phosphor mixed silicon resin creeping up a reflection wall 204.

FIG. 7 illustrates a problem that may be experienced with package 200 having reflection wall 204 and translucent part 203 which is made by filling sealing resin. As shown in FIG. 7, phosphor mixed silicon resin creeps up reflection wall 204 in the process of filling and curing the resin. As a result, the area of reflection wall 204 is substantially reduced. Further, a surface shape of translucent part 203 differs from a desired designed shape. Consequently, reflection wall 204 does not perform as expected. Moreover, the phosphor mixed silicon resin creeping up reflection wall 204 also results in translucent part 203 being concave. As a result, an optical path of a light ray passing through the center of translucent part 203 is shorter than that of a light ray passing through the periphery of translucent part 203. This causes a different excitation and luminescence of the phosphor between a center and a peripheral part of translucent part 203. Consequently, color tone deteriorates.

SUMMARY

Consistent with the present invention, there is device to emit a light beam provided. The device comprises a light emitting element and an outer envelope defining an indentation in which the light emitting element is positioned. The indentation comprises a first indentation part corresponding to a lower part of the indentation, and a second indentation part corresponding to an upper part of the indentation. The device also comprises a projection strip between the first and second indentation parts, the projection strip projecting from an inner surface of the outer envelope; and a conductive lead coupled to the light emitting element to supply electrical power.

DESCRIPTION

Figure 1:
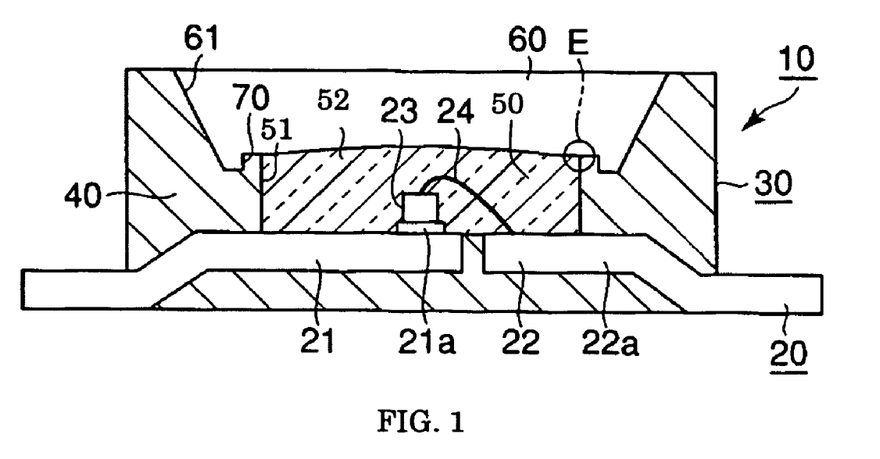
FIG. 1 is a vertical section of an optical semiconductor device 10.
Figure 2:
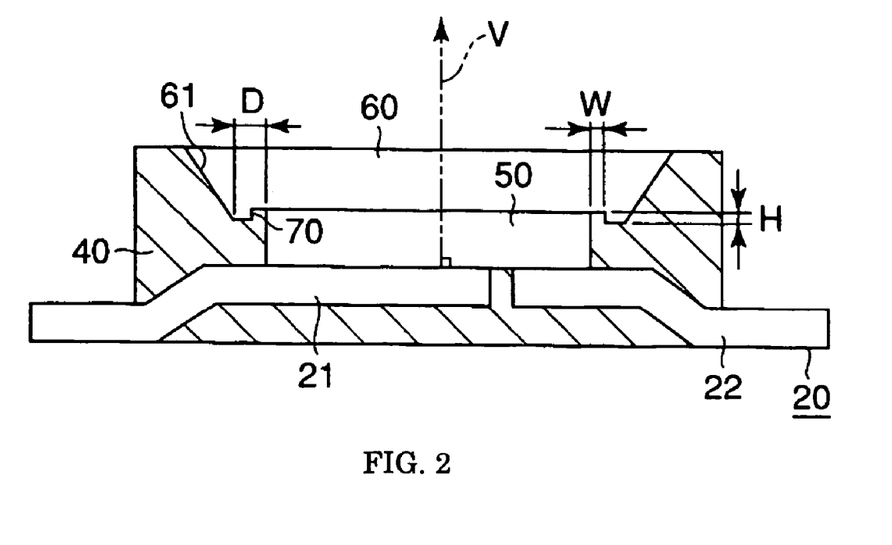
FIG. 2 is a vertical section of an outer envelope of device 10.
Figure 3:
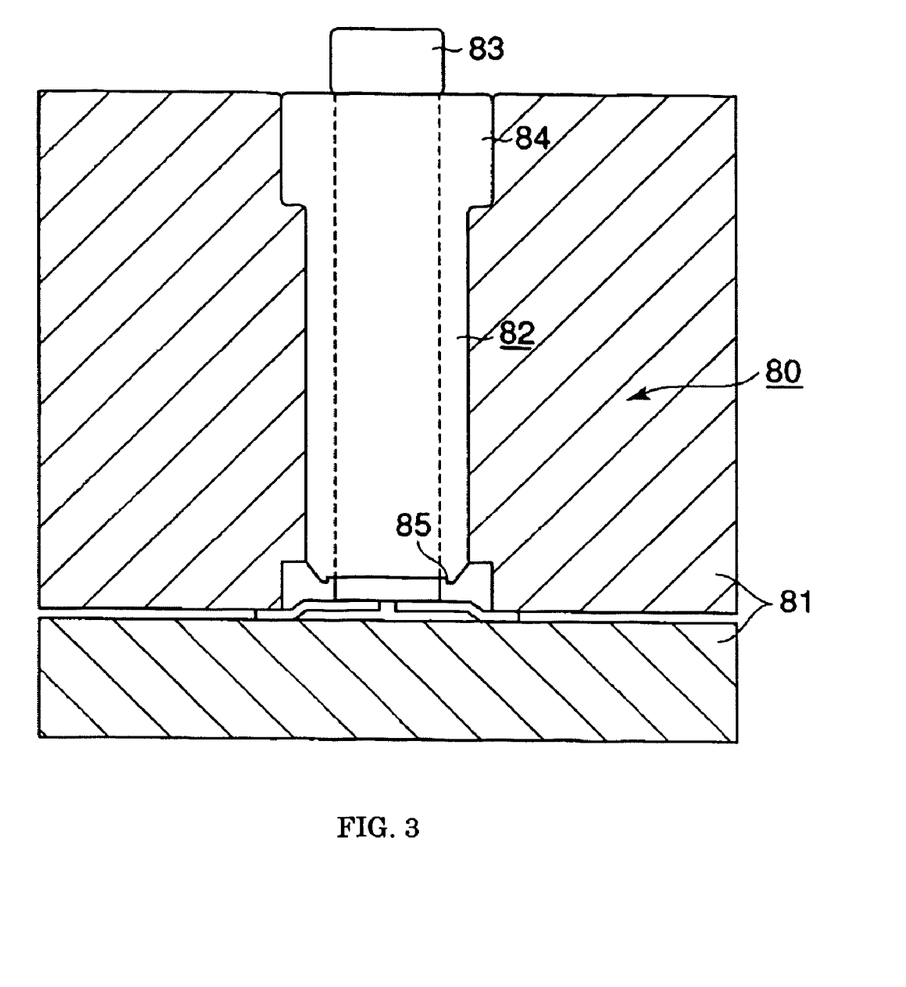
FIG. 3 is a vertical section of a die 80 which is used to manufacture device 10.

FIG. 1 is a vertical section of an optical semiconductor device 10 consistent with an embodiment of the present invention. FIG. 2 is a vertical section of an outer envelope 30 of device 10. FIG. 3 is a vertical section of a die 80 which is used to manufacture device 10.

Device 10 includes an electrically conductive lead 20 and outer envelope 30. Lead 20 is composed of copper. Ni, Pd and Au are sequentially plated with predetermined respective thicknesses to the copper surface of lead 20. As a result, the plated Au is exposed as a surface of a lead frame of lead 20.

Lead 20 comprises a first lead part 21 (a first conductive lead) and second lead part 22 (a second conductive lead). Lead parts 21 and 22 have electrodes 21a and 22a, respectively.

A light emitting element 23 such as a surface-mounted LED (an optical semiconductor device) which emits ultraviolet light is secured on electrode 21a. An electrode of light emitting element 23 is conductively connected to electrode 22a by a wire 24 made of gold.

Outer envelope 30 has a base part 40 composed of a white thermoplastic resin. Base part 40 includes a first indentation part 50 and a second indentation part 60. Second indentation part 60 is formed outside of first indentation part 50. In other words, first and second indentation parts 50 and 60 form one consecutive indentation including a lower side corresponding to first indentation 50 defined by a first wall 51 and an upper side corresponding to second indentation part 60 defined by a second wall 61, wherein the diameter of the first wall is smaller than the diameter of the second wall.

A projection strip 70 is provided along an outer edge of first indentation part 50, which edge corresponds to a boundary between first indentation part 50 and second indentation part 60. Projection strip 70 projects from an inner surface of outer envelope 30.

First indentation part 50 is filled with phosphor mixed silicon resin (optical resin) to form a translucent part 52. Phosphor mixed silicon resin comprises silicon resin, which is thermoplastic resin, mixed with a phosphor which emits visible light in response to ultraviolet light emitted from light emitting element 23. Second indentation part 60 is tapered to first indentation part 50. The internal surface of second indentation part 60, which is second wall 61, serves as a reflection wall.

Projection strip 70 (FIG. 2) projects in a direction of an arrow V, from the bottom of indentation 50 toward the opening thereof. In other words, direction V is a normal line of a plane forming a principal surface of lead 20. A height H of projection strip 70 from the bottom of second indentation part 60 is set to be approximately 0.1 mm. A width W of projection strip 70 is set to be approximately 0.05 mm in this embodiment.

A method for manufacturing device 100 is explained next. First, conductive lead 20 is set in an injection molding die 80 (FIG. 3) to carry out an insert molding. Die 80 comprises a first die part 81 and a second die part 82. First die part 81 is a die to form an outer surface of outer envelope 30. Second die part 82 is a die to form first and second indentation parts 50 and 60, and projection strip 70.

Prehardened steel such as HPM-38 may be used for a cavity of die 80. The steel is heat treated so as to have a Rockwell hardness (HRC) ranging from 53 to 55.

Second die part 82 (FIG. 3) comprises a sleeve die part 84 and a core pin die part 83. Sleeve die part 84 is hollow-cylindrical shaped having a tapered surface proximate one end thereof to form reflection wall 61. Core pin die part 83 which penetrates sleeve die part 84 is a sealing resin-filled die. The reason for applying these dies is explained next.

In order to form a small projection strip with an integral die, it would be necessary to form a trench in a single integral die. However, forming such a trench near a peripheral part of the integral die is difficult. Moreover, an inflection point of the trench may involve unintended roundness. Hence, it is preferable to apply a compound mold using sleeve die part 83 and core pin die part 84 to avoid such roundness.

Forming a shoulder corresponding to projection strip 70 in inner side of sleeve die part 84, makes it possible to form a small trench 85 (FIG. 3) by combining with sleeve die 83. That is, an outer surface of core pin die part 83 corresponds to an inner surface of projection strip 70 while an inner surface of sleeve die part 84 corresponds to an outer surface of projection strip 70. This structure precludes unintentional rounding so that edged projection 70 can be formed. As for the upper portion of projection 70, which is identified by a chain double-dashed line E in FIG. 1, it is preferable to form a sharp corner to prevent a resin leak.

Injection molding is carried out using die 80 with a tool temperature of approximately 130 degrees centigrade, an apparent viscosity of molten resin at the time of passing through a gate of approximately 300 [PaS] and a dwell pressure application of approximately 120 [MPa]. One example of a suitable resin, polyphthalamide (PPA) includes not less than approximately 5 wt. % titanium oxide.

After the molding, second die 82 is pulled out in the vertical direction in FIG. 3. Conductive adhesive is applied on electrode 22a (FIG. 1). Then light emitting element 23 is mounted on electrode 22a so that light emitting element 23 is placed in first indentation part 50. Wire 24 is bonded between light emitting element 23 and electrode 22a by wire bonding so that electrical power can be supplied to light emitting element 23 through lead 22 and wire 24.

Phosphor mixed silicon resin, which is a thermosetting resin, (translucent optical resin) is filled into first indentation part 50. Projection strip 70 keeps the filled resin from creeping up reflection surface 61 of second indentation part 60, so that there is no optical resin on reflection surface 61.

The phosphor mixed silicon resin is cured by applying 100-degree centigrade heat for 2 hours, 145-degree centigrade heat for the next 4 hours, and 180-degree centigrade heat for the last 4 hours. As a result, the phosphor mixed silicon resin is cured to form translucent part 51 (phosphor resin part).

In operation, optical semiconductor device 10 emits a visible light beam by exciting a phosphor in translucent part 51 in response to an ultraviolet beam emitted from light emitting element 23. The visible light beam outputted from translucent part 51 is reflected off reflection surface 61. Then, the light beam proceeds in a vertical direction in FIG. 1. Designing an angle, material and surface roughness of reflection surface 61 makes it possible to control the outgoing direction of the light beam emitted from device 10.

Since project strip 70 prevents resin filled into first indentation part 50 from creeping up second indentation part 60, spreading of the resin onto reflection surface 61 is prevented, so that reflection surface 61 can have an expected reflection effect.

Further, forming a concave shape of translucent part 51 caused by creeping up of the silicon resin, is also restrained so that color tone of the emitted light beam can be maintained.

In addition, variation of the amount of filled resin can be tolerated since projecting strip 70 serves as a dam so that any excess resin is prevented from flowing out. As a result, the amount of filled resin can have a margin in manufacturing device 10, which leads to better productivity.

Setting a height of projection strip 70 not less than approximately 0.1 mm, a width of projection strip 70 not less than approximately 0.05 mm, has an effect for averting overflow of the filled resin. Therefore, it is recommended to provide projection strip 70 having a height equal to or more than approximately 0.1 mm, a width equal to or more than approximately 0.05 mm. In this embodiment, a distance D (FIG. 2) between reflection surface 61 and the inner surface of first indentation part 50 in the radial direction, is not less than approximately 1.3 mm.

As explained above, prevents projection strip 70 at a boundary between first indentation part 50 and second indentation part 60, prevents silicon resin filled into first indentation part 50 from creeping up reflection surface 61. Consequently, the intensity and diameter of the light beam emitted by device 10 can be maintained. Projection strip 70 also provides a margin for controlling the amount of the filled resin so that productivity can be improved.

Figure 4:
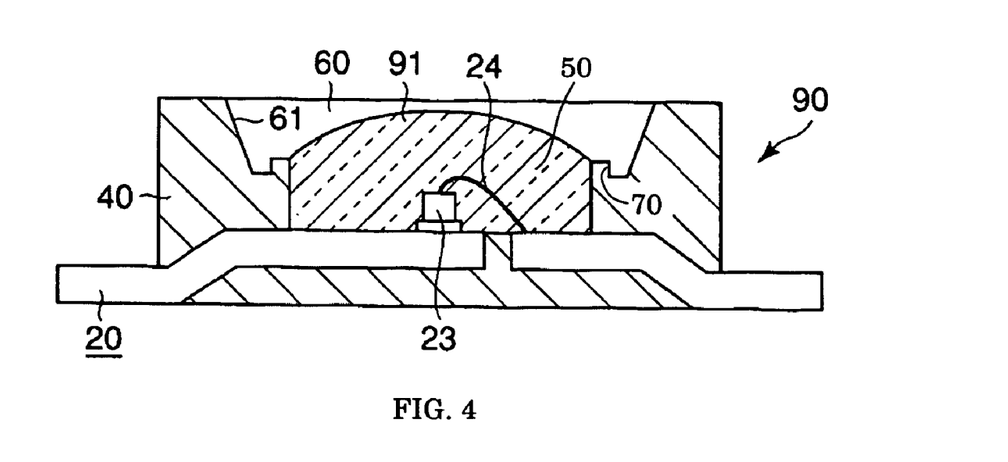
FIG. 4 is a vertical section of an optical semiconductor device 90.

FIG. 4 illustrates a vertical section of an optical semiconductor device 90 consistent with a second embodiment of the present invention. In FIG. 4, elements having the same function as that of the elements shown in the first embodiment, are given the same reference numbers.

In this embodiment, a transparent silicon resin is filled into first indentation part 50 instead of filling phosphor mixed silicon resin. In other words, resin filled into indentation 50 does not render color.

In this embodiment, transparent silicon resin is filled to an extent so as not to overflow by surface tension. Then, the filled resin is cured to form a transparent resin part 91 with a package upside down. In other words, after the filling process, a surface of the filled optical resin is oriented downward to make the surface concave. As a result, transparent resin part 91 has a convex shape which serve as a lens.

Device 90 also has the same sort of the effect of device 10.

Numerous modifications of the present invention are possible in light of the above teachings. It is therefore to be understood that, within the scope of the appended claims, the present invention can be practiced in a manner other than as specifically described herein. When a certain effect can be accomplished without some elements shown in this embodiment, such elements can be omitted.

What is claimed is:

1. A device to emit a light beam, comprising:
    a light emitting element;
    an outer envelope defining an indentation in which the light emitting element is positioned, wherein the indentation comprises
      (i) a first indentation part corresponding to a lower part of the indentation, the light emitting element being placed in the first indentation part, and
      (ii) a second indentation part corresponding to an upper part of the indentation;
    an optical resin filling the first indentation part;
    a projection strip between the first and second indentation parts, the projection strip projecting from an inner surface of the outer envelope and preventing the optical resin from creeping up a surface of the second indentation part; and
    a conductive lead coupled to the light emitting element to supply electrical power.

2. The device according to claim 1, wherein the optical resin comprises a thermosetting resin containing a phosphor.

3. The device according to claim 1, wherein the light emitting element is for emitting ultraviolet light.

4. The device according to claim 1, wherein the light emitting element is for emitting visible light.

5. The device according to claim 1, wherein a surface of the optical resin is convex.

6. The device according to claim 1, wherein the projection strip projects in a direction of a normal line of a primary plane of the conductive lead.

7. The device according to claim 1, wherein the conductive lead comprises a first conductive lead on which the light emitting element is positioned and a second conductive lead which is connected to the light emitting element by a wire.

8. A device to emit a light beam comprising:
    a light emitting element;
    an outer envelope defining an indentation in which the light emitting element is positioned, wherein the indentation comprises:
      (i) a first indentation part defined by a first wall and corresponding to a lower part of the indentation, the light emitting element being placed in the first indentation part, and
      (ii) a second indentation part defined by a second wall and corresponding to an upper part of the indentation;
    an optical resin filling the first indentation part;
    a projection strip between the first and second walls, the projection strip projecting from an inner surface of the outer envelope; and
    a conductive lead coupled to the light emitting element to supply electrical power.

9. The device according to claim 8, wherein the projection strip prevents the optical resin from creeping up the second wall.

10. The device according to claim 8, wherein the second indentation part is tapered toward the first indentation part.

11. A method of manufacturing an optical semiconductor device, comprising:
    setting a conductive lead in a die, the die comprising (i) a first die part and (i) a second die part that comprises a core pin die part and a sleeve die part;
    filling the die with a first resin to form an outer envelope and a projection strip, the outer envelope forming an indentation comprising a first indentation part corresponding to a lower part of the indentation and a second indentation part corresponding to an upper part of the indentation, the projection strip being provided between the first and second indentation parts and projecting from an inner surface of the indentation, wherein filling the die comprises:
      (i) filling the first die part to form an outer surface of the outer envelope, and
      (ii) filling the second die part to form the indentation with the first resin, wherein filling the second die part comprises filling the core pin die part to form an inner surface of the projection strip, and filling the sleeve die part to form an outer surface of the projection strip with the first resin;
    positioning a light emitting element in the first indentation part; and
    filling a second resin into the first indentation part, the second resin being an optical resin.

12. A method of manufacturing an optical semiconductor device according to claim 11, wherein positioning a light emitting element includes placing a light emitting element for emitting ultraviolet light.

13. A method of manufacturing an optical semiconductor device according to claim 11, further comprising placing a surface of the filled second resin downward so that the second resin forms with a convex surface.

* * * * *